United States Patent
Miyazaki et al.

(10) Patent No.: US 6,478,882 B2
(45) Date of Patent: Nov. 12, 2002

(54) CONDUCTIVE PASTE AND LAMINATED CERAMIC ELECTRONIC COMPONENT USING THE SAME

(75) Inventors: Takaharu Miyazaki, Shiga-ken; Tsuyoshi Yamana, Kyoto, both of (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/893,174

(22) Filed: Jun. 27, 2001

(65) Prior Publication Data

US 2002/0124910 A1 Sep. 12, 2002

(30) Foreign Application Priority Data

Jul. 5, 2000 (JP) .......................... 2000-204096

(51) Int. Cl.[7] ............................................. B23K 35/363
(52) U.S. Cl. ........................... 148/23; 148/24; 361/313; 361/523
(58) Field of Search ..................... 148/23, 24; 361/313, 361/523

(56) References Cited

U.S. PATENT DOCUMENTS 5,158,708 A * 10/1992 Yamamoto et al. ......... 252/512
5,561,587 A * 10/1996 Sanada ..................... 361/306.1

FOREIGN PATENT DOCUMENTS

| JP | 7-56850 | 6/1995 |
| JP | 8-259847 | 10/1996 |

\* cited by examiner

*Primary Examiner*—Daniel J. Jenkins
(74) *Attorney, Agent, or Firm*—Dickstein, Shapiro, Morin & Oshinsky, LLP.

(57) ABSTRACT

A laminated ceramic electronic component, such as a laminated ceramic capacitor, having superior heat shock resistance and humidity loading resistance is provided, in which no delamination occurs during a firing step. A conductive paste advantageously used for forming internal electrodes and a laminated ceramic electronic component using the conductive paste are provided. The conductive paste is a conductive powder primarily composed of Ni; an organic vehicle; a compound A which is at least one of an organic acid metal salt, an organic metal complex salt and an alkoxide, and which contains at least one of Mg, Ca and Ba; and a hydrolyzed compound B containing at least one of Al and Si; wherein the hydrolyzed compound B is adhered to the surface of the conductive powder.

20 Claims, 1 Drawing Sheet

CONDUCTIVE PASTE AND LAMINATED CERAMIC ELECTRONIC COMPONENT USING THE SAME

BACKGROUND OF THE INVENTION

1. Field of the Invention

The present invention relates to conductive pastes and laminated ceramic electronic components, and more particularly, relates to a conductive paste advantageously used for internal electrodes of laminated ceramic electronic components and to a laminated ceramic capacitor using the conductive paste.

2. Description of the Related Art

Heretofore, laminated ceramic electronic components, such as laminated ceramic capacitors, have laminates comprising a plurality of ceramic layers and at least one internal electrode formed along a predetermined interface between the ceramic layers.

In the laminated ceramic electronic components, internal electrodes are generally formed by a step of printing a conductive paste containing a conductive powder and an organic vehicle, which are dispersed in a solvent, and a subsequent step of firing the conductive paste thus printed. In more detail, a laminated ceramic electronic component is formed by steps of printing a conductive paste, which is to be used as internal electrodes, on predetermined ceramic green sheets, which forms ceramic layers by firing; laminating the ceramic green sheets with each other; bonding the ceramic green sheets with each other by compression; and firing the ceramic green sheets bonded together; whereby the internal electrodes are simultaneously sintered together with the ceramic green layers, and a ceramic laminate provided with the internal electrodes is formned. In the steps described above, the melting point of the conductive powder, which forms the internal electrodes, must be not less than the sintering temperature for the ceramic. When the melting point of the conductive powder is less than the sintering temperature for the ceramic, the conductive powder is melted during firing, and breakages may occur in the internal electrode after the firing is performed, resulting in degradation of the coverage. Accordingly, as the conductive powder, Pt, Pd, W, Nb, Ni and the like may be used, and in order to reduce the cost, Ni, which is a base metal, is used as the conductive powder.

In a laminated ceramic electronic component having internal electrodes composed of a base metal such as Ni, concomitant with the trends toward thinner ceramic layers and an increased number of ceramic layers, the following problems may arise. Residual stress remaining at the interfaces between the internal electrodes and the ceramic layers is increased due to the differences in shrinkage, and in coefficient of thermal expansion, caused by sintering the electrode films formed by printing and the ceramic green layers. As a result, a problem may arise in that heat shock resistance of the laminated ceramic electronic component is degraded. In addition, concomitant with the trends toward thinner ceramic layers and an increased number of ceramic layers, another problem may also arise in that the reliability of the laminated ceramic electronic component at a high temperature under a high humidity condition, i.e., so-called high humidity loading characteristics, is degraded.

Furthermore, as the thickness of the ceramic layer is decreased, the thickness of the internal electrode layer must also be decreased, and hence, it is required that the particle size of the conductive powder which is contained in the conductive paste for forming the internal electrode must be further decreased. However, when the particle size of the conductive powder is further decreased, since the shrinkage of the internal electrode which is caused by sintering of the conductive powder during firing occurs at an even lower temperature, a problem may arise in that delamination of the ceramic layers is likely to occur.

In order to solve the latter problem, i.e., the problem of delamination, for example, a laminated ceramic capacitor formed by bonding an internal electrode composed of Ni to a ceramic layer by using an aluminosilicate layer is disclosed in Japanese Examined Patent Application Publication No. 7-56850. However, this laminated ceramnic capacitor does not address the former problem, that is, the problem of poor heat shock resistance.

In addition, in Japanese Unexamined Patent Application Publication No. 8-259847, a conductive paste using powdered metal covered with a reaction product of an organic silicone compound and water is disclosed. However, when this conductive paste is used for forming an internal electrode for a laminated ceramic capacitor, the silicon contained in the conductive paste reacts with the ceramic, and as a result, abnormal grain growth of the ceramic occurs, whereby the former problem, i.e., the problem of poor heat shock resistance, cannot be reduced.

SUMMARY OF THE INVENTION

Accordingly, an object of the present invention is to provide a conductive paste which generates no delamination during firing and which has superior heat shock resistance and humidity loading resistance, and to provide a laminated ceramic electronic component comprising internal electrodes formed of the conductive paste described above.

To these ends, a conductive paste of the present invention comprises a conductive powder primarily comprising Ni; an organic vehicle; a compound A comprising at least one material selected from the group consisting of an organic acid metal salt, an organic metal complex salt and an alkoxide, containing at least one element selected from the group consisting of Mg, Ca and Ba; and a hydrolyzed compound B containing at least one of Al and Si; wherein the hydrolyzed compound B is adhered to the surface of the conductive powder.

In addition, a conductive paste of the present invention comprises a conductive powder primarily comprising Ni; an organic vehicle; a compound A comprising at least one material selected from the group consisting of an organic acid metal salt, an organic metal complex salt and an alkoxide, containing at least one element selected from the group consisting of Mg, Ca and Ba; and a hydrolyzed compound B containing at least one of Al and Si; wherein the compound A and the hydrolyzed compound B are adhered to the surface of the conductive powder.

The compound B may comprise a hydrolysable reactive group, and the hydrolysable reactive group is preferably an alkoxyl group.

The compound B may comprise an alkoxide.

The compound B may comprise at least one material selected from the group consisting of an aluminum chelate compound, an aluminum alkoxide, a silane monomer and a silicon alkoxide.

The adhesion amount of the hydrolyzed compound B is preferably about 0.1 to 5.0 wt %, in the form of $SiO_2$ and $Al_2O_3$, with respect to 100 wt % of the conductive powder.

The molar ratio of Si, in the form of $SiO_2$, contained in the hydrolyzed compound B to the total of Mg, Ca and Ba, in the form of MgO, CaO and BaO, respectively, contained in the compound A is preferably in the range of about 0.5 to 10.0.

In addition, the molar ratio of Al, in the form of $Al_2O_3$, contained in the hydrolyzed compound B to the total of Mg, Ca and Ba, in the form of MgO, CaO and BaO, respectively, contained in the compound A is preferably in the range of about 0.5 to 4.0.

A laminated ceramic electronic component of the present invention comprises a laminate having ceramic layers laminated with each other and internal electrodes provided along predetermined interfaces between the ceramic layers, wherein the internal layers are formed by firing the conductive paste according to the present invention.

In addition, the laminated ceramic electronic component described above may further comprise terminal electrodes provided at different positions on side surfaces of the laminate, wherein the internal electrodes are in electrical contact with the terminal electrodes.

Furthermore, the ceramic layer of the laminated ceramic electronic component may primarily comprise barium titanate.

DESCRIPTION OF THE PREFERRED EMBODIMENTS

Figure 1:
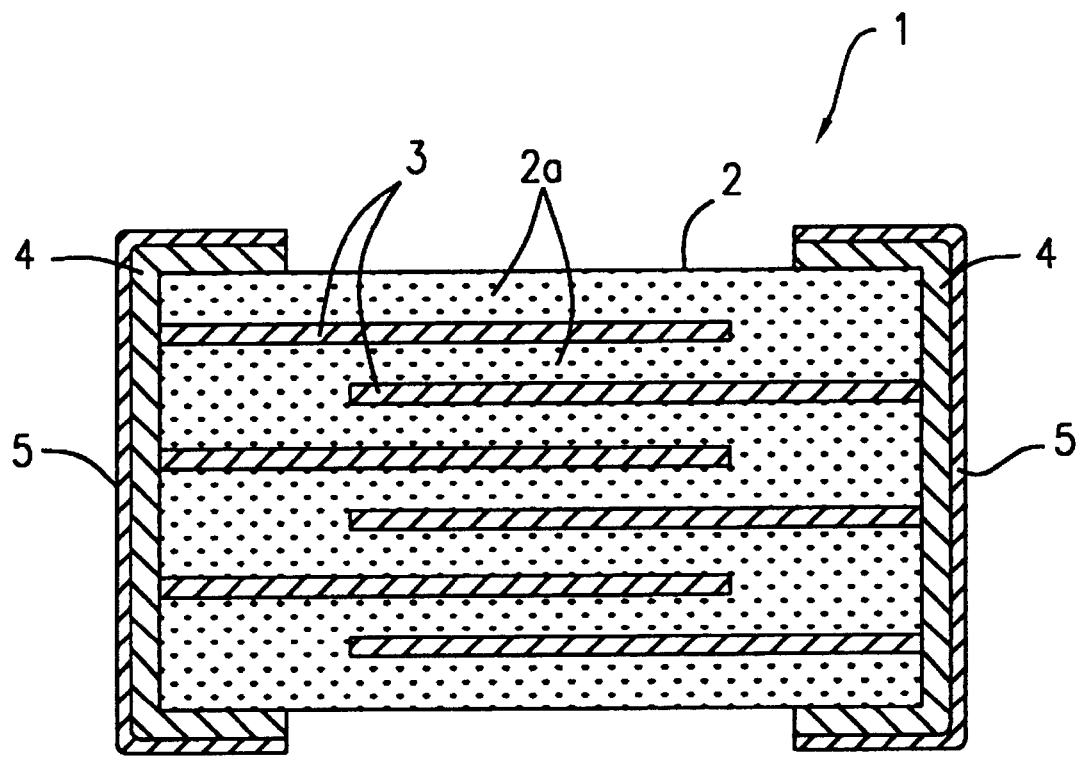
FIG. 1 is a cross-sectional view showing a laminated ceramic capacitor of an embodiment according to the present invention.

A conductive paste of the present invention comprises a compound A and a hydrolyzed compound B, and at least the hydrolyzed compound B is adhered to the surface of a conductive powder. Accordingly, a treatment method for adhering the hydrolyzed compound B on the surface of the conductive powder according to an embodiment will be described below. In this connection, the conductive paste and the laminated ceramic electronic component of the present invention are not limited to those described in the embodiment below.

First, as the conductive powder, for example, powdered Ni is prepared. As the conductive powder, a material containing Cu, Ag, Au, Pt or Pd, or an alloy thereof, may be optionally used in addition to the Ni. The average particle diameter of the conductive powder is not specifically limited. In general, when the conductive powder is composed of fine particles, the shrinkage of the internal electrode occurs at an even lower temperature during sintering of the conductive powder, and hence, delamination is likely to occur; however, since the present invention can suppress the phenomenon described above, when the average particle diameter of the conductive powder is in the range of about 10 to 200 nm, the present invention provides a significant advantage.

Next, the conductive powder is dispersed in an organic solvent, such as an alcohol, thereby forming a suspension. When a conductive powder having an average particle diameter of less than about 1 μm, stirring is effective to promote the dispersion of the conductive powder, and when necessary, a dispersing machine, such as an ultrasonic homogenizer, may be used.

The compound B is added to the suspension and is dispersed therein. The compound B must comprise a hydrolysable group containing at least one of Al and Si. In particular, the compound B preferably comprises at least one material selected from the group consisting of an aluminum chelate compound, an aluminum alkoxide, a silane monomer and a silicon alkoxide. In more particular, for example, there may be mentioned aluminum alkoxides, such as tri-i-propoxy aluminum, tri-n-butoxy aluminum, di-i-propoxy acetoalkoxy aluminum and di-i-propoxy ethylacetoacetate aluminum; and silicon alkoxide, such as tetraethoxy silane, tetramethoxy silane, methyltriethoxy silane and dimethylethoxy silane.

Next, water is added or dripped to the suspension so as to hydrolyze the compound B. When a compound B having a high rate of hydrolysis is used, it is preferable that when necessary, a mixture of water diluted with an organic solvent or a mixture of water and an appropriate amount of a chelating agent, such as an amine derivative or a compound containing a carboxyl group, be used in the dripping step. In addition, when a compound B having a low rate of hydrolysis is used, it is preferable that a mixture be used containing water and an appropriate amount of a hydrolytic catalyst, such as a mineral acid or aqueous ammonia.

When in. addition to the compound B, the compound A is also adhered to the conductive powder, the compound A is also added to the suspension when the compound B is added to the suspension and is dispersed. The compound A must contain at least one element selected from the group consisting of Mg, Ca and Ba, and must also comprise at least one material selected from the group consisting of an organic acid metal salt, a metal organic complex salt and an alkoxide.

As the compound A, there may be mentioned, for example, an organic acid metal salt, such as magnesium formate, magnesium acetate, magnesium lactate, magnesium stearate, magnesium octylate, calcium formate, calcium acetate, calcium lactate, calcium stearate, calcium octylate, barium formate, barium acetate, barium lactate, barium stearate or barium octylate; a metal organic complex salt, such as magnesium acetylacetonate, calcium acetylacetonate or barium acetylacetonate; or an alkoxide, such as di-n-butoxy magnesium, diethoxy magnesium, diethoxy barium or ditripropoxy barium.

In the case in which the compound A is also adhered to the conductive powder, the adhesion mode is not specifically limited. However, when the compound A has a hydrolysable reactive group, such as an alkoxide, the compound A is hydrolyzed and is then adhered to the conductive powder.

Next, the solvent and water are separated by filtration, decantation and the like, and drying is then performed, thereby yielding a conductive powder having a hydrolyzed product of the compound B adhered thereon or, in addition to that, having the compound A adhered thereon.

The adhesion amount of the hydrolyzed compound B of the present invention is preferably in the range of about 0.1 to 5.0 wt %, when calculated in the form of $SiO_2$ and $Al_2O_3$, with respect to 100 wt % of the conductive powder. When the adhesion amount is about 0.1 wt % or more, the effect of reducing the residual stress generated at the interface between the internal electrode and the ceramic layer is easily obtained, and hence, the generation of delamination can be more reliably suppressed. In addition, when the adhesion amount is about 5.0 wt % or less, the effect of improving the heat shock resistance of the electrode formed by printing and firing the conductive paste can be easily obtained.

With respect to the total amount of Mg, Ca and Ba, calculated as MgO, CaO and BaO, respectively, contained in the compound A of the present invention, the molar ratio of Si, calculated as $SiO_2$, contained in the compound B of the present invention is preferably in the range of about 0.5 to 10.0. When the molar ratio described above is about 0.5 or more, the effect of reducing the residual stress generated at the interface between the internal electrode and the ceramic layer is easily obtained, and hence, the generation of delamination can be more reliably suppressed. In addition, when the molar ratio described above is about 10 or less, the effect of improving the heat shock resistance of the electrode formed by printing and firing the conductive paste can be easily obtained.

With respect to the total amount of Mg, Ca and Ba, in the form of MgO, CaO and BaO, respectively, contained in the compound A of the present invention, the molar ratio of Al, in the form of $Al_2O_3$, contained in the compound B of the present invention is preferably in the range of about 0.5 to 4.0. When the molar ratio described above is about 0.5 or more, the effect of reducing the residual stress generated at the interface between the internal electrode and the ceramic layer is easily obtained, and hence, the generation of delamination can be more reliably suppressed. In addition, when the molar ratio described above is about 4.0 or less, the effect of improving the heat shock resistance of the electrode formed by printing and firing the conductive paste can be easily obtained.

As one aspect of the present invention, the conductive paste comprises the conductive powder having the hydrolyzed compound B adhered thereto formed by, for example, the method described above; an organic vehicle; and the compound A. In another aspect of the present invention, the conductive powder comprises an organic vehicle and a conductive powder having the compound A and the hydrolyzed compound B adhered thereto formed by, for example, the method described above.

The method for manufacturing the conductive paste of the present invention is not specifically limited; however, similar to the conventional method for manufacturing a general conductive paste, for example, the conductive paste may be prepared by a step of dispersing a conductive powder in an organic vehicle followed by a mixing step.

When the conductive paste of the present invention is prepared, a conductive paste having the compound A and the hydrolyzed compound B adhered thereto may be used, or when necessary, a conductive paste additionally processed by a heating treatment at about 200 to 800° C. in an air or nitrogen atmosphere may also be used.

An embodiment of a laminated ceramic electronic component of the present invention will be described in detail with reference to FIG. 1. That is, a laminated ceramic electronic component 1 comprises a ceramic laminate 2, internal electrodes 3, terminal electrodes 4 and plated films 5. The ceramic laminate 2 is formed by, for example, firing a green ceramic laminate of a plurality of ceramic layers 2a composed of a dielectric material primarily containing $BaTiO_3$.

The internal electrodes 3 are disposed between the ceramic layers 2a of the ceramic laminate 2, and is formed by printing the conductive paste of the present invention on a plurality of green ceramic layers 2a and by firing the conductive paste therewith. For example, the internal electrodes 3 are formed so that one edge thereof is exposed on one of the side surfaces of the ceramic laminate 2.

For example, when the edges of the internal electrodes 3 are exposed on the side surfaces of the ceramic laminate 3, terminal electrodes 4 are formed by a step of applying a conductive paste for forming terminal electrodes on the side surfaces of the ceramic laminate 2 and by a subsequent step of firing the conductive paste so as to be electrically and mechanically bonded to the internal electrodes 3.

The plated films 5 are formed by, for example, electroless plating of Sn or Ni, or solder plating, and at least one layer is formed on each terminal electrode 4.

The material for the ceramic laminate 2 is not limited to that in the embodiment described above, and the ceramic laminate 2 may be formed of another dielectric material, such as $PbZrO_3$, an insulating material, a magnetic material or a semiconductor material.

The number of the internal electrodes 3 of the laminated ceramic electronic component of the present invention is not limited to that in the embodiment described above, and any number of internal electrodes may be formed.

The terminal electrodes 4 are generally formed by a step of applying a conductive paste which contains a conductive powder for forming the terminal electrodes, on a fired ceramic laminate 2 and by a subsequent firing step. In addition to the method described above, the terminal electrodes 4 may be formed by applying the conductive paste on a green ceramic layer before firing and by firing the conductive paste together with the ceramic laminate. Furthermore, the positions at which the internal electrodes are formed and the numbers thereof are not limited to those in the embodiment described above.

In addition, the plated films 5 are not limited to those described in this embodiment; hence, it is not always necessary to form films and, in addition, any number of layers may be formed.

EXAMPLES

EXAMPLE 1

In this example, a laminated ceramic capacitor having a structure shown in FIG. 1 is formed as a laminated ceramic electronic component.

As a nonreducing dielectric ceramic constituting the ceramic layers, powdered starting ceramic materials having an average particle diameter of 0.3 μm were prepared and were then measured, mixed and calcined so as to form a ceramic represented by the formula $\{(Ba_{1-x}Ca_x)O\}_m(Ti_{1-y}Zr_y)O_2$, in which m, x and y are in the ranges of $1.005 \leq m \leq 1.03$, $0.02 \leq x \leq 0.22$, and $0 < y \leq 1.20$, respectively. Next, a polyvinyl butyral-based binder and an organic solvent such as ethanol were added to the calcined ceramic described above, and the mixture thus formed was then wet-mixed using a ball mill, thereby yielding a ceramic slurry. Subsequently, sheets were formed from the ceramic slurry by the doctor blade method, thereby obtaining rectangular ceramic green sheets 5 μm thick.

Next, 100 g of powdered Ni produced by a chemical vapor deposition method was dispersed in 0.2 liter of ethanol so as to form a suspension, and a dispersing treatment was then performed on the suspension using an ultrasonic homogenizer. Predetermined amounts of magnesium acetate as the compound A and tetraethoxy silane as the compound B were dissolved in the suspension and were then stirred, thereby obtaining suspensions of samples 1 to 15.

Subsequently, after a mixture composed of 10 g of purified water and 10 g of aqueous ammonia was dripped to each of the suspensions of samples 1 to 15 using a roller pump, stirring was performed for 12 hours, whereby magnesium acetate, which was the compound A, was adhered to the surface of the powdered Ni, and in addition, a hydrolyzed tetraethoxy silane, the tetraethoxy silane being the compound B, was adhered to the surface of the powdered Ni. Solid-liquid separation was performed on the mixed solution thus obtained by decantation, and the solid obtained there-from was dried at 120° C. for 12 hours, whereby conductive powders of samples 1 to 15 were obtained having magnesium acetate and the hydrolyzed tetraethoxy silane thereon. The adhesion amounts of the magnesium acetate and the hydrolyzed tetraethoxy silane, in the forms of MgO and $SiO_2$, respectively, were as shown in Table 1.

In addition, in a manner similar to the steps performed for forming samples 1 to 15 except that tetraethoxy silane as the compound B was not added to the suspension, magnesium acetate as the compound A was adhered to the surface of the powdered Ni, whereby conductive powder of samples 16 to 18 were obtained.

Next, 42 wt % of each of the conductive powders of samples 1 to 18, 44 wt % of an organic vehicle composed of 6 parts by weight of an ethyl cellulose-based organic binder dissolved in 94 parts by weight of terpineol, and 14 wt % of terpineol were mixed together and dispersed by the ball mill method, thereby obtaining conductive pastes of samples 1 to 18.

The oxide content on weight percent basis with respect to 100 wt % of the conductive powder and molar ratio $SiO_2/MgO$ of each sample are shown in Table 1.

Next, the conductive pastes of samples 1 to 18 were screen-printed on the ceramic green sheets described above, thereby forming conductive paste films for forming the internal electrodes. In the step described above, by changing the thickness of the screen pattern, the coating thickness (in terms of a Ni metal, measured by an x-ray type thickness meter) for the electrode film was controlled to be 0.5 μm.

Next, a ceramic laminate which was formed by laminating a plurality of the ceramic green sheets described above so that the side of a ceramic green sheet to which the conductive paste extended was opposite to that of ceramic green sheets adjacent thereto, was heated to 300° C. in a nitrogen atmosphere for burning the organic binder and was then fired in a reducing atmosphere formed of a $H_2$—$N_2$—$H_2O$ gas, thereby obtaining ceramic laminates of samples 1 to 18. In the firing step, a temperature of 1,200° C. was maintained for 2 hours, and the rates of increase and decrease in temperature were set to be 200° C./hr.

A conductive paste containing silver was applied on two side surfaces of each of the ceramic laminates of samples 1 to 18 and was then fired at 800° C. in a $N_2$-air atmosphere, thereby forming terminal electrodes electrically connected to the internal electrodes. Next, Ni plated layers were formed on the terminal electrodes described above, and solder plated layers were formed on the Ni plated layers, thereby forming laminated ceramic capacitors of samples 1 to 18. The exterior dimensions of the laminated ceramic capacitor of each sample thus obtained were 1.6 mm in wide, 3.2 mm in length and 1.2 mm in thick; the thickness of the internal electrode was 0.7 μm, the thickness of the dielectric ceramic layer disposed between the internal electrodes was 3 μm and the total number of effective dielectric ceramic layers was 150.

The rate of occurrence of delamination, the relative dielectric constants and the mean time to failure by an accelerated life test were measured for the laminated ceramic capacitors of samples 1 to 18. The measurement results and the ranking thereof are shown in Table 1.

The rate of occurrence of delamination was measured by forming a hundred test pieces from each sample, cutting the planar surface of test piece in the direction perpendicular to the longitudinal direction thereof, polishing the cut surface of the test piece in a bonded state with a resin, checking for the presence of cracks on the polished cut surface using a microscope, and if any, counting the number of test pieces having cracks, whereby the rate of occurrence with respect to the hundred test pieces was obtained.

The time to failure of a test piece by an accelerated life test was obtained by measuring the insulating resistance over time while applying a DC electric field of 10 V/mm to the test piece at 150° C., and the time to failure of the test piece was defined when the insulating resistance was decreased to less than $10^5$ Ω, whereby the mean time to failure was obtained by averaging the results of the hundred test pieces.

Concerning the ranking, a sample of the present invention, which had a rate of occurrence of delamination of 0%, a relative dielectric constant higher than those of the laminated ceramic capacitors of comparative samples 17 and 18, and a mean time to failure longer than those of the laminated ceramic capacitors thereof was marked as "Excellent"; a sample of the present invention, which only had an inferior relative dielectric constant compared to those of the laminated ceramic capacitors of comparative samples 17 and 18 was marked as "Good"; a sample of the present invention, which had an inferior relative dielectric constant or a mean time to failure compared to those of the laminated ceramic capacitors of the samples marked as "Excellent" and "Good", but had superior features compared to the laminated ceramic capacitors of comparative samples 17 and 18 was marked as "Fair"; and the laminated ceramic capacitors of the comparative samples were marked as "Poor".

TABLE 1

| | Conductive powder | | | Laminated Ceramic Capacitor | | | |
|---|---|---|---|---|---|---|---|
| Sample No. | Compound A Content of Magnesium Acetate as MgO (wt %) | Compound B Content of Tetraethoxy Silane as $SiO_2$ (wt %) | $SiO_2$/MgO (Molar Ratio) | Rate of Occurrence of Delamination (n = 100) | Relative Dielectric Constant | Accelerated Life Test Mean Time to Failure (Hour) | Ranking |
| 1 | 0.3 | 0.1 | 0.2 | 0 | 2,090 | 76 | Good |
| 2 | 0.1 | 0.1 | 0.5 | 0 | 3,230 | 74 | Excellent |
| 3 | 0.007 | 0.1 | 10.0 | 0 | 3,360 | 90 | Excellent |
| 4 | 0.005 | 0.1 | 15.0 | 0 | 2,380 | 32 | Good |
| 5 | 3.0 | 1.0 | 0.2 | 0 | 2,030 | 73 | Good |
| 6 | 1.0 | 1.0 | 0.5 | 0 | 3,180 | 74 | Excellent |
| 7 | 0.07 | 1.0 | 10.0 | 0 | 3,130 | 77 | Excellent |
| 8 | 0.05 | 1.0 | 15.0 | 0 | 2,900 | 36 | Good |
| 9 | 17.0 | 5.0 | 0.2 | 0 | 1,750 | 72 | Good |
| 10 | 7.0 | 5.0 | 0.5 | 0 | 3,030 | 74 | Excellent |

TABLE 1-continued

| | Conductive powder | | | Laminated Ceramic Capacitor | | | |
|---|---|---|---|---|---|---|---|
| Sample No. | Compound A Content of Magnesium Acetate as MgO (wt %) | Compound B Content of Tetraethoxy Silane as SiO$_2$ (wt %) | SiO$_2$/MgO (Molar Ratio) | Rate of Occurrence of Delamination (n = 100) | Relative Dielectric Constant | Accelerated Life Test Mean Time to Failure (Hour) | Ranking |
| 11 | 0.3 | 5.0 | 10.0 | 0 | 3,140 | 73 | Excellent |
| 12 | 0.2 | 5.0 | 15.0 | 0 | 3,110 | 27 | Good |
| 13 | 23.0 | 7.0 | 0.2 | 0 | 1,480 | 24 | Fair |
| 14 | 9.0 | 7.0 | 0.5 | 0 | 1,590 | 27 | Fair |
| 15 | 0.5 | 7.0 | 10.0 | 0 | 1,520 | 20 | Fair |
| 16 | 1.0 | 0.0 | 0.0 | 100 | — | — | Poor |
| 17 | 5.0 | 0.0 | 0.0 | 82 | 2,150 | 2 | Poor |
| 18 | 10.0 | 0.0 | 0.0 | 55 | 1,730 | 3 | Poor |

As can be seen from Table 1, the laminated ceramic capacitors of samples 2, 3, 6, 7, 10 and 11 in which about 0.1% to 5.0 wt % of hydrolyzed tetraethoxy silane, tetraethoxy silane being the compound B, in the form of SiO$_2$, was adhered to 100 wt % of the conductive powder, and the molar ratio of Si, in the form of SiO$_2$, contained in the tetraethoxy silane to Mg, in the form of MgO, contained in the magnesium acetate, which was the compound A, was in the range of about 0.5 to 10.0 were in the particularly preferable range of the present invention. The reasons the laminated ceramic capacitors described above were in the particularly preferable range of the present invention were that the rates of occurrence of delamination thereof were all 0%; the relative dielectric constants were 3,030 to 3,360, which were significantly higher than the dielectric constant of 2,150 of the laminated ceramic capacitor of comparative sample 17; and the mean times to failure by an accelerated life test were 73 to 90 hours, which were significantly longer than a mean time to failure of 3 hours of the laminated-ceramic capacitor of comparative sample 18.

The laminated ceramic capacitors of samples 1, 5 and 9, in which about 0.1% to 5.0 wt % of hydrolyzed tetraethoxy silane, in the form of SiO$_2$, was adhered to 100 wt % of the conductive powder, and the molar ratio of Si, in the form of SiO$_2$, contained in the tetraethoxy silane to Mg, in the form of Mg, contained in the magnesium acetate was less than about 0.5, were in the preferable range of the present invention. The reasons the laminated ceramic capacitors described above were in the preferable range of the present invention were that the relative dielectric constants of the laminated ceramic capacitors were in the acceptable range, although the relative dielectric constants of 1,750 to 2,090 thereof were slightly lower than the dielectric constant of 2,150 of the laminated ceramic capacitor of comparative sample 17; the rates of occurrence of delamination of these laminated ceramic capacitors were all 0%; and the mean times to failure by an accelerated life test were 72 to 76 hours, which were significantly longer than a mean time to failure of 3 hours of the laminated ceramic capacitor of comparative sample 18.

The laminated ceramic capacitors of samples 4, 8 and 12, in which about 0.1% to 5.0 wt % of hydrolyzed tetraethoxy silane, in the form of SiO$_2$, was adhered to 100 wt % of the conductive powder, and the molar ratio of Si, in the form of SiO$_2$, contained in the tetraethoxy silane to Mg, in the form of MgO, contained in the magnesium acetate was more than about 10.0, were in the preferable range of the present invention. The reasons the laminated ceramic capacitors described above were in the preferable range of the present invention were that the mean times to failure thereof were significantly longer than a mean time to failure of 3 hours of the laminated ceramic capacitor of comparative sample 18, although mean times to failure of 27 to 36 hours obtained by an accelerated life test of the laminated ceramic capacitors of samples 4, 8 and 12 were inferior to those of the laminated ceramic capacitors of samples 2, 3, 6, 7, 10 and 11 in the particularly preferable range of the present invention; the rates of occurrence of delamination were all 0%; and the relative dielectric constants were 2,380 to 3,110, which were significantly higher than a relative dielectric constant of 2,150 of the laminated ceramic capacitor of comparative sample 17.

The laminated ceramic capacitors of samples 13 to 15, in which about 7.0 wt % of hydrolyzed tetraethoxy silane, in the form of SiO$_2$, was adhered to 100 wt % of the conductive powder were in the range of the present invention, and the reasons the laminated ceramic capacitors described above were in the range of the present invention were that although the relative dielectric constants thereof were 1,480 to 1,590, which were inferior to a dielectric constant of 2,150 of the laminated ceramic capacitor of comparative sample 17, and the mean times to failure by an accelerated life test were 20 to 27 hours, which were inferior to those of the laminated ceramic capacitors of samples 2, 3, 6, 7, 10 and 11 in the particularly preferable range of the present invention, the relative dielectric constants of the laminated ceramic capacitors of samples 13 to 15 were in the acceptable range of laminated ceramic capacitors; the mean times to failure thereof were sufficiently longer compared to a mean time to failure of 3 hours of the laminated ceramic capacitor of comparative sample 18; and the rates of occurrence of delamination were all 0%.

In contrast, in the laminated ceramic capacitors of comparative samples 16 to 18, having no hydrolyzed compound B adhered to the powdered Ni, the rates of occurrence of delamination were high, such as 55% to 100%, and the mean times to failure were very short, such as up to 3 hours. In addition, since the laminated ceramic capacitor of sample 16 had a rate of occurrence of delamination of 100%, the relative dielectric constant and the mean time to failure thereof could not be measured.

EXAMPLE 2

In a manner substantially equivalent to that in Example 1, conductive powders of samples 19 to 36 were prepared except that calcium octylate was used as the compound A, and methyltriethoxy silane was used as the compound B, and subsequently, laminated ceramic capacitors of samples 19 to 36 were formed. In this example, oxide contents of the individual samples on weight percent basis with respect to 100 wt % of the conductive powder and the molar ratio $SiO_2/CaO$ are shown in Table 2.

The rate of occurrence of delamination, relative dielectric constants and mean time to failure by an accelerated life test were measured for the laminated ceramic capacitors of samples 19 to 36, and the measurement results and the ranking thereof are shown in Table 2. The measurement and ranking were performed in a manner similar to that in Example 1.

of 1,750 to 2,010 were slightly lower than the relative dielectric constant of 2,050 of comparative sample 35; the rates of occurrence of delamination of these laminated ceramic capacitors were all 0%; and the mean times to failure by an accelerated life test were 72 to 76 hours, which were significantly longer than a mean time to failure of 3 hours of the laminated ceramic capacitor of comparative sample 36.

The laminated ceramic capacitors of samples 22, 26 and 30, in which about 0.1% to 5.0 wt % of hydrolyzed methyltriethoxy silane, in the form of $SiO_2$, was adhered to 100

TABLE 2

| | Conductive powder | | | Laminated Ceramic Capacitor | | | |
|---|---|---|---|---|---|---|---|
| Sample No. | Compound A Content of Calcium Octylate as CaO (wt %) | Compound B Content of Methyltriethoxy Silane as $SiO_2$ (wt %) | $SiO_2$/CaO (Molar Ratio) | Rate of Occurrence of Delamination (n = 100) | Relative Dielectric Constant | Accelerated Life Test Mean Time to Failure (Hour) | Ranking |
| 19 | 0.5 | 0.1 | 0.2 | 0 | 2,010 | 76 | Good |
| 20 | 0.2 | 0.1 | 0.5 | 0 | 3,230 | 74 | Excellent |
| 21 | 0.01 | 0.1 | 10.0 | 0 | 3,360 | 90 | Excellent |
| 22 | 0.006 | 0.1 | 15.0 | 0 | 3,380 | 30 | Good |
| 23 | 5.0 | 1.0 | 0.2 | 0 | 2,030 | 73 | Good |
| 24 | 2.0 | 1.0 | 0.5 | 0 | 3,180 | 74 | Excellent |
| 25 | 0.1 | 1.0 | 10.0 | 0 | 3,130 | 77 | Excellent |
| 26 | 0.06 | 1.0 | 15.0 | 0 | 2,900 | 34 | Good |
| 27 | 23.0 | 5.0 | 0.2 | 0 | 1,750 | 72 | Good |
| 28 | 9.0 | 5.0 | 0.5 | 0 | 3,030 | 74 | Excellent |
| 29 | 0.5 | 5.0 | 10.0 | 0 | 3,140 | 73 | Excellent |
| 30 | 0.3 | 5.0 | 15.0 | 0 | 3,010 | 27 | Good |
| 31 | 33.0 | 7.0 | 0.2 | 0 | 1,480 | 22 | Fair |
| 32 | 13.0 | 7.0 | 0.5 | 0 | 1,560 | 25 | Fair |
| 33 | 0.7 | 7.0 | 10.0 | 0 | 1,580 | 20 | Fair |
| 34 | 1.0 | 0.0 | 0.0 | 100 | — | — | Poor |
| 35 | 5.0 | 0.0 | 0.0 | 89 | 2,050 | 2 | Poor |
| 36 | 10.0 | 0.0 | 0.0 | 55 | 1,730 | 3 | Poor |

As can be seen from Table 2, the laminated ceramic capacitors of samples 20, 21, 24, 25, 28 and 29, in which about 0.1% to 5.0 wt % of hydrolyzed methyltriethoxy silane, in the form of $SiO_2$, was adhered to 100 wt % of the conductive powder, and the molar ratio of Si, in the form of $SiO_2$, contained in the methyltriethoxy silane to Ca, in the form of CaO, contained in the calcium octylate was in the range of about 0.5 to 10.0 were in the particularly preferable range of the present invention. The reasons the laminated ceramic capacitors described above were in the particularly preferable range of the present invention were that the rates of occurrence of delamination were all 0%; the relative dielectric constants were 3,030 to 3,360, which were significantly higher than the relative dielectric constant of 2,050 of comparative sample 35; and the mean times to failure by an accelerated life test were 73 to 90 hours, which were significantly longer than a mean time to failure of 3 hours of comparative sample 36.

The laminated ceramic capacitors of samples 19, 23, and 27, in which about 0.1% to 5.0 wt % of hydrolyzed methyltriethoxy silane, in the form of $SiO_2$, was adhered to 100 wt % of the conductive powder, and the molar ratio of Si, in the form of $SiO2$, contained in the methyltriethoxy silane to Ca, in the form of CaO, contained in the calcium octylate was less than about 0.5, were in the preferable range of the present invention. The reasons the laminated ceramic capacitors described above were in the preferable range of the present invention were that the relative dielectric constants thereof were in the acceptable range as the laminated ceramic capacitor, although the relative dielectric constants wt % of the conductive powder, and the molar ratio of Si, in the form of $SiO_2$, contained in the methyltriethoxy silane to Ca, in the form of CaO, contained in the calcium octylate was more than about 10.0, were in the preferable range of the present invention. The reasons the laminated ceramic capacitors described above were in the preferable range of the present invention were that the mean times to failure thereof were significantly longer than the mean time to failure of 3 hours of comparative sample 36, although the mean times to failure of 27 to 34 hours by an accelerated life test of the laminated ceramic capacitors of samples 22, 26 and 30 were inferior to those of the laminated ceramic capacitors of samples 20, 21, 24, 25, 28 and 29 in the particularly preferable range of the present invention; the rates of occurrence of delamination were all 0%; and the relative dielectric constants were 2,900 to 3,380, which were significantly higher than a relative dielectric constant of 2,050 of laminated ceramic capacitor of comparative sample 35.

The laminated ceramic capacitors of samples 31 to 33, in which 7.0 wt % of hydrolyzing methyltriethoxy silane, in the form of $SiO_2$, was adhered to 100 wt % of the conductive powder, were in the range of the present invention, and the reasons the laminated ceramic capacitors described above were in the range of the present invention were that although the relative dielectric constants thereof were 1,480 to 1,580, which were inferior to the relative dielectric constant of 2,050 of the laminated ceramic capacitor of comparative sample 35, and the mean times to failure by an accelerated life test were 20 to 25 hours, which were inferior to those of the laminated ceramic capacitors of samples 20, 21, 24, 25, 28 and 29 in the particularly preferable range of the present invention, the relative dielectric constants of the laminated ceramic capacitors of samples 31 to 33 were in the acceptable range of laminated ceramic capacitors; the mean times to failure were sufficiently longer compared to a mean time to failure of 3 hours of comparative sample 36; and the rates of occurrence of delamination were all 0%.

In contrast, in the laminated ceramic capacitors of comparative samples 34 to 36, having no hydrolyzed compound B adhered to the powdered Ni, the rates of occurrence of delamination were high, such as 55% to 100%, and the mean times to failure were very short, such as up to 3 hours. In addition, since the laminated ceramic capacitor of sample 34 had a rate of occurrence of delamination of 100%, the relative dielectric constant and the mean time to failure could not be measured.

EXAMPLE 3

In a manner substantially equivalent to that in Example 1, conductive powders of samples 37 to 54 were prepared except that barium acetylacetonate was used as the compound A, and vinyltriethoxy silane was used as the compound B, and subsequently, laminated ceramic capacitors of samples 37 to 54 were formed. In this example, oxide contents of the individual samples in weight percent basis with respect to 100 wt % of the conductive powder and the molar ratio $SiO_2/BaO$ are shown in Table 3.

The rate of occurrence of delamination, relative dielectric constants, mean time to failure by an accelerated life test were measured for the laminated ceramic capacitors of samples 37 to 54, and the measurement result and the ranking thereof are shown in Table 3. The measurements and ranking were performed in a manner similar to that in Example 1.

$SiO_2$, contained in the vinyltriethoxy silane to Ba, in the form of BaO, contained in the acetylacetonate barium was in the range of about 0.5 to 4.0 were in the particularly preferable range of the present invention. The reasons the laminated ceramic capacitors described above were in the particularly preferable range of the present invention were that the rates of occurrence of delamination thereof were all 0%; the relative dielectric constants were 3,010 to 3,360, which were significantly higher than the relative dielectric constant of 2,140 of the laminated ceramic capacitor of comparative sample 53; and the mean times to failure by an accelerated life test were 73 to 80 hours, which were significantly longer than a mean time to failure of 3 hours of comparative sample 54.

The laminated ceramic capacitors of samples 37, 41 and 45, in which about 0.1% to 5.0 wt % of hydrolyzed vinyltriethoxy silane, in the form of $SiO_2$, was adhered to 100 wt % of the conductive powder, and the molar ratio of Si, in the form of $SiO_2$, contained in the vinyltriethoxy silane to Ba, in the form of BaO, contained in the acetylacetonate barium was less than about 0.5, were in the preferable range of the present invention. The reasons the laminated ceramic capacitors of samples 37, 41 and 45 were in the preferable range of the present invention were that the relative dielectric constants thereof were in the acceptable range as a laminated ceramic capacitor, although relative dielectric constants of 1,750 to 2,070 were slightly lower than the relative dielectric constant of 2,140 of the laminated ceramic capacitor of comparative sample 53; the rates of occurrence of delamination of these ceramic capacitors were all 0%; and the mean times to failure by an accelerated life test were 72 to 76 hours, which were significantly longer than a mean time to failure of 3 hours of the laminated ceramic capacitor of comparative sample 54.

The laminated ceramic capacitors of samples 40, 44 and 48, in which about 0.1% to 5.0 wt %. of hydrolyzed

TABLE 3

| | Conductive powder | | | Laminated Ceramic Capacitor | | | |
|---|---|---|---|---|---|---|---|
| Sample No. | Compound A Content of Barium Acetylacetonate as BaO (wt %) | Compound B Content of Vinyltriethoxy Silane as $SiO_2$ (wt %) | $SiO_2$/BaO (Molar Ratio) | Rate of Occurrence of Delamination (n = 100) | Relative Dielectric Constant | Accelerated Life Test Mean Time to Failure (Hour) | Ranking |
| 37 | 1.0 | 0.1 | 0.2 | 0 | 2,070 | 76 | Good |
| 38 | 0.5 | 0.1 | 0.5 | 0 | 3,230 | 74 | Excellent |
| 39 | 0.03 | 0.1 | 10.0 | 0 | 3,360 | 80 | Excellent |
| 40 | 0.02 | 0.1 | 15.0 | 0 | 2,380 | 32 | Good |
| 41 | 10.0 | 1.0 | 0.2 | 0 | 1,930 | 73 | Good |
| 42 | 5.0 | 1.0 | 0.5 | 0 | 3,180 | 74 | Excellent |
| 43 | 0.3 | 1.0 | 10.0 | 0 | 3,130 | 87 | Excellent |
| 44 | 0.2 | 1.0 | 15.0 | 0 | 2,900 | 36 | Good |
| 45 | 64.0 | 5.0 | 0.2 | 0 | 1,750 | 72 | Good |
| 46 | 25.0 | 5.0 | 0.5 | 0 | 3,010 | 74 | Excellent |
| 47 | 1.0 | 5.0 | 10.0 | 0 | 3,140 | 73 | Excellent |
| 48 | 0.8 | 5.0 | 15.0 | 0 | 2,810 | 24 | Good |
| 49 | 89.0 | 7.0 | 0.2 | 0 | 1,480 | 24 | Fair |
| 50 | 36.0 | 7.0 | 0.5 | 0 | 1,490 | 25 | Fair |
| 51 | 2.0 | 7.0 | 10.0 | 0 | 1,520 | 20 | Fair |
| 52 | 1.0 | 0.0 | 0.0 | 100 | — | — | Poor |
| 53 | 5.0 | 0.0 | 0.0 | 79 | 2,140 | 2 | Poor |
| 54 | 10.0 | 0.0 | 0.0 | 59 | 1,640 | 3 | Poor |

As can be seen from Table 3, the laminated ceramic capacitors of samples 38, 39, 42, 43, 46 and 47, in which about 0.1% to 5.0 wt % of hydrolyzed vinyltriethoxy silane, in the form of SiO2, was adhered to 100 wt % of the conductive powder, and the molar ratio of Si, in the form of vinyltriethoxy silane, in the form of $SiO_2$, was adhered to 100 wt % of the conductive powder, and the molar ratio of Si, in the form of $SiO_2$, contained in the vinyltriethoxy silane to Ba, in the form of BaO, contained in the acetylacetonate barium was more than about 10.0, were in the preferable range of the present invention. The reasons the laminated ceramic capacitors of samples 40, 44 and 48 were in the preferable range of the present invention were that the mean times to failure thereof were significantly longer than the mean time to failure of 3 hours of the laminated ceramic capacitor of comparative sample 54, although mean times to failure of 24 to 36 hours by an accelerated life test of the laminated ceramic capacitors of samples 40, 44 and 48 were inferior to those of the laminated ceramic capacitors of samples 38, 39, 42, 43, 46 and 47 in the particularly preferable range of the present invention; the rates of occurrence of delamination were all 0%; and the relative dielectric constants were 2,380 to 2,900, which were significantly higher than a relative dielectric constant of 2,140 of the laminated ceramic capacitor of comparative sample 53.

The laminated ceramic capacitors of samples 49 to 51, in which 7.0 wt % of hydrolyzed vinyltriethoxy silane, in the form of $SiO_2$, was adhered to 100 wt % of the conductive powder, were in the range of the present invention, and the reasons the laminated ceramic capacitors of samples 49 to 51 were in the range of the present invention were that although the relative dielectric constants thereof were 1,480 to 1,520, which were inferior to the relative dielectric constant of 2,140 of the laminated ceramic capacitors of comparative sample 53, and the mean times to failure by an accelerated life test were 20 to 25 hours, which were inferior to those of the laminated ceramic capacitors of samples 38, 39, 42, 43, 46 and 47 in the particularly preferable range of the present invention, the relative dielectric constants of the laminated ceramic capacitors of samples 49 to 51 were in the acceptable range as a laminated ceramic capacitor; the mean times to failure were sufficiently longer compared to a mean time to failure of 3 hours of comparative sample 54; and the rates of occurrence of delamination were all 0%.

In contrast, in the laminated ceramic capacitors of comparative samples 52 to 54, having no hydrolyzed compound B adhered to the powdered Ni, the rates of occurrence of delamination were high, such as 59% to 100%, and the mean times to failure were very short, such as up to 3 hours. In addition, since the laminated ceramic capacitor of sample 52 had a rate of occurrence of delamination of 100%, the relative dielectric constant and the mean time to failure could not be measured.

EXAMPLE 4

In a manner substantially equivalent to that in Example 1, conductive powders of samples 55 to 72 were prepared except that magnesium octylate was used as the compound A, and tri-i-propoxy aluminum was used as the compound B, and subsequently, laminated ceramic capacitors of samples 55 to 72 were formed. In this example, oxide contents of the individual samples in weight percent basis with respect to 100 wt % of the conductive powder and the molar ratio $Al_2O_3BaO$ are shown in Table 4.

The rate of occurrence of delamination, relative dielectric constants, mean time to failure by an accelerated life test were measured for the laminated ceramic capacitors of samples 55 to 72, and the measurement result and the ranking thereof are shown in Table 4. The measurements and ranking were performed in a manner similar to that in Example 1.

TABLE 4

| | Conductive powder | | | Laminated Ceramic Capacitor | | | |
|---|---|---|---|---|---|---|---|
| Sample No. | Compound A Content of Magnesium Octylate as MgO (wt %) | Compound B Content of Tri-i-propoxy Aluminum as $Al_2O_3$ (wt %) | $Al_2O_3$/MgO (Molar Ratio) | Rate of Occurrence of Delamination (n = 100) | Relative Dielectric Constant | Accelerated Life Test Mean Time to Failure (Hour) | Ranking |
| 55 | 0.2 | 0.1 | 0.2 | 0 | 2,090 | 79 | Good |
| 56 | 0.08 | 0.1 | 0.5 | 0 | 3,130 | 76 | Excellent |
| 57 | 0.01 | 0.1 | 4.0 | 0 | 3,160 | 83 | Excellent |
| 58 | 0.007 | 0.1 | 6.0 | 0 | 2,780 | 32 | Good |
| 59 | 2.0 | 1.0 | 0.2 | 0 | 2,120 | 81 | Good |
| 60 | 0.8 | 1.0 | 0.5 | 0 | 3,180 | 78 | Excellent |
| 61 | 0.1 | 1.0 | 4.0 | 0 | 3,230 | 75 | Excellent |
| 62 | 0.07 | 1.0 | 6.0 | 0 | 2,600 | 36 | Good |
| 63 | 10.0 | 5.0 | 0.2 | 0 | 2,050 | 79 | Good |
| 64 | 4.0 | 5.0 | 0.5 | 0 | 3,480 | 78 | Excellent |
| 65 | 0.5 | 5.0 | 4.0 | 0 | 3,340 | 72 | Excellent |
| 66 | 0.3 | 5.0 | 6.0 | 0 | 3,210 | 41 | Good |
| 67 | 14.0 | 7.0 | 0.2 | 0 | 1,680 | 29 | Fair |
| 68 | 6.0 | 7.0 | 0.5 | 0 | 2,690 | 25 | Fair |
| 69 | 1.0 | 7.0 | 4.0 | 0 | 3,120 | 22 | Fair |
| 70 | 1.0 | 0.0 | 0.0 | 100 | — | — | Poor |
| 71 | 5.0 | 0.0 | 0.0 | 81 | 2,140 | 2 | Poor |
| 72 | 10.0 | 0.0 | 0.0 | 52 | 1,730 | 3 | Poor |

As can be seen from Table 4, the laminated ceramic capacitors of samples 56, 57, 60, 61, 64 and 65 were in the particularly preferable range of the present invention, and had about 0.1% to 5.0 wt % of hydrolyzed tri-i-propoxy aluminum, in the form of $Al_2O_3$, was adhered to 100 wt % of the conductive powder, and a molar ratio of Al, in the form of $Al_2O_3$, contained in the tri-i-propoxy aluminum to Mg, in the form of MgQ, contained in the magnesium octylate of about 0.5 to 4.0. The reasons the laminated ceramic capacitors of samples 56, 57, 60, 61, 64 and 65 were in the particularly preferable range of the present invention were that the rates of occurrence of delamination thereof were all 0%; the relative dielectric constants were 3,130 to 3,480, which were much higher than the relative dielectric constant of 2,140 of the laminated ceramic capacitors of comparative sample 71; and the mean times to failure by an accelerated life test were 72 to 83 hours, which were significantly longer than a mean time to failure of 3 hours of the laminated ceramic capacitor of the comparative sample 72.

The laminated ceramic capacitors of samples 55, 59 and 63 were in the preferable range of the present invention, having about 0.1% to 5.0 wt % of hydrolyzed tri-i-propoxy aluminum, in the form of $Al_2O_3$, adhered to 100 wt % of the conductive powder, and a molar ratio of Al, in the form of $Al_2O_3$, contained in the tri-i-propoxy aluminum to Mg, in the form of MgO, contained in the magnesium octylate of less than about 0.5. The reasons the laminated ceramic capacitors of samples 55, 59 and 63 were in the preferable range of the present invention were that the relative dielectric constants thereof were in the acceptable range as a laminated ceramic capacitor, although the relative dielectric constants of 2,050 to 2,120 were slightly lower than the relative dielectric constant of 2,140 of the laminated ceramic capacitors of comparative sample 71; the rates of occurrence of delamination were all 0%; and the mean times to failure by an accelerated life test were 79 to 81 hours, which were significantly longer than a mean time to failure of 3 hours of the laminated ceramic capacitor of the comparative sample 72.

The laminated ceramic capacitors of samples 58, 62 and 66 in which about 0.1% to 5.0 wt % of hydrolyzed tri-i-propoxy aluminum, in the form of $Al_2O_3$, was adhered to 100 wt % of the conductive powder, and the molar ratio of Al, in the form of $Al_2O_3$, contained in the tri-i-propoxy aluminum to Mg, in the form of MgO, contained in the magnesium octylate was more than about 4.0, were in the preferable range of the present invention. The reasons the laminated ceramic capacitors of samples 58, 62 and 66 were in the preferable range of the present invention were that the mean times to failure thereof were significantly longer than the mean time to failure of 3 hours of the laminated ceramic capacitor of comparative sample 72, although the mean times to failure of 32 to 41 hours by an accelerated life test of the laminated ceramic capacitors of samples 58, 62 and 66 were inferior to those of the laminated ceramic capacitors of samples 56, 57, 60, 61, 64 and 65 in the particularly preferable range of the present invention; the rates of occurrence of delamination were all 0%; and the relative dielectric constants were 2,600 to 3,210, which were significantly higher than the relative dielectric constant of 2,140 of the laminated ceramic capacitor of comparative sample 71.

The laminated ceramic capacitors of samples 67 to 69, in which 7.0 wt % of hydrolyzed tri-i-propoxy aluminum, in the form of $Al_2O_3$, was adhered to 100 wt % of the conductive powder, were in the range of the present invention, and the reasons the laminated ceramic capacitors of samples 67 to 69 were in the range of the present invention were that although the relative dielectric constants thereof were 1,680 to 3,120, which were inferior to the relative dielectric constant of 2,140 of the laminated ceramic capacitor of comparative sample 71, and the mean times to failure by an accelerated life test were 22 to 29 hours, which were inferior to those of the laminated ceramic capacitors of samples 56, 57, 60, 61, 64 and 65 in the particularly preferable range of the present invention, the relative dielectric constants of the laminated ceramic capacitors of samples 67 to 69 were in the acceptable range as a laminated ceramic capacitor; the mean times to failure were sufficiently longer compared to a mean time to failure of 3 hours of the laminated ceramic capacitor of comparative sample 72; and the rates of occurrence of delamination were all 0%.

In contrast, in the laminated ceramic capacitors of comparative samples 70 to 72, having no hydrolyzed compound B adhered to the powdered Ni, the rates of occurrence of delamination were high, such as 52% to 100%, and the mean times to failure were very short, such as up to 3 hours. In addition, since the laminated ceramic capacitor of sample 70 had a rate of occurrence of delamination of 100%, the relative dielectric constant and the mean time to failure thereof could not be measured.

EXAMPLE 5

In a manner substantially equivalent to that in Example 1, conductive powders of samples 73 to 90 were prepared except that barium acetylacetonate was used as the compound A, and di-i-propoxy acetoalkoxy aluminum was used as the compound B, and subsequently, laminated ceramic capacitors of samples 73 to 90 were formned. In this example, oxide contents of the individual samples in weight percent basis with respect to 100 wt % of the conductive powder and the molar ratio $Al_2O_3/CaO$ are shown in Table 5.

The rate of occurrence of delamination, relative dielectric constants, mean time to failure by an accelerated life test were measured for the laminated ceramic capacitors of samples 73 to 90, and the measurement result and the ranking thereof are shown in Table 5. The measurements and ranking were performed in a manner similar to that in Example 1.

TABLE 5

| | Conductive powder | | | Laminated Ceramic Capacitor | | | |
|---|---|---|---|---|---|---|---|
| | Compound A | Compound B | | | | | |
| Sample No. | Content of Calcium Formate as CaO (wt %) | Content of Di-i-Propoxy Acetoalkoxy Aluminum as $Al_2O_3$ (wt %) | $Al_2O_3$/CaO (Molar Ratio) | Rate of Occurrence of Delamination (n = 100) | Relative Dielectric Constant | Accelerated Life Test Mean Time to Failure (Hour) | Ranking |
| 73 | 0.3 | 0.1 | 0.2 | 0 | 2,110 | 79 | Good |
| 74 | 0.1 | 0.1 | 0.5 | 0 | 3,230 | 76 | Excellent |
| 75 | 0.015 | 0.1 | 4.0 | 0 | 3,250 | 82 | Excellent |
| 76 | 0.010 | 0.1 | 6.0 | 0 | 2,760 | 29 | Good |
| 77 | 2.8 | 1.0 | 0.2 | 0 | 2,090 | 79 | Good |
| 78 | 1.1 | 1.0 | 0.5 | 0 | 3,280 | 78 | Excellent |
| 79 | 0.15 | 1.0 | 4.0 | 0 | 3,130 | 75 | Excellent |
| 80 | 0.10 | 1.0 | 6.0 | 0 | 2,620 | 35 | Good |
| 81 | 14.0 | 5.0 | 0.2 | 0 | 2,060 | 79 | Good |
| 82 | 5.5 | 5.0 | 0.5 | 0 | 3,280 | 81 | Excellent |
| 83 | 0.7 | 5.0 | 4.0 | 0 | 3,240 | 72 | Excellent |

TABLE 5-continued

| | Conductive powder | | Laminated Ceramic Capacitor | | | | |
|---|---|---|---|---|---|---|---|
| | Compound A | Compound B | | | | | |
| Sample No. | Content of Calcium Formate as CaO (wt %) | Content of Di-i-Propoxy Acetoalkoxy Aluminum as Al₂O₃ (wt %) | Al₂O₃/CaO (Molar Ratio) | Rate of Occurrence of Delamination (n = 100) | Relative Dielectric Constant | Accelerated Life Test Mean Time to Failure (Hour) | Ranking |
| 84 | 0.5 | 5.0 | 6.0 | 0 | 3,200 | 40 | Good |
| 85 | 19.0 | 7.0 | 0.2 | 0 | 1,350 | 28 | Fair |
| 86 | 8.0 | 7.0 | 0.5 | 0 | 2,670 | 25 | Fair |
| 87 | 1.0 | 7.0 | 4.0 | 0 | 2,620 | 20 | Fair |
| 88 | 1.0 | 0.0 | 0.0 | 100 | — | — | Poor |
| 89 | 5.0 | 0.0 | 0.0 | 79 | 2,140 | 2 | Poor |
| 90 | 10.0 | 0.0 | 0.0 | 54 | 1,630 | 3 | Poor |

As can be seen from Table 5, the laminated ceramic capacitors of samples 74, 75, 78, 79, 82, and 83, in which about 0.1% to 5.0 wt % of hydrolyzed di-i-propoxy acetoalkoxy aluminum in the form of $Al_2O_3$, was adhered to 100 wt % of the conductive powder, and the molar ratio of Al, in the form of $Al_2O_3$, contained in the di-i-propoxy acetoalkoxy aluminum to Ca, in the form of CaO, contained in the barium acetylacetonate was in the range of about 0.5 to 4.0, were in the particularly preferable range of the present invention. The reasons the laminated ceramic capacitors of samples 74, 75, 78, 79, 82 and 83 were in the particularly preferable range of the present invention were that the rates of occurrence of delamination thereof were all 0%; the relative dielectric constants were 3,130 to 3,280, which were much higher than the relative dielectric constant of 2,140 of the laminated ceramic capacitor of comparative sample 89; and the mean times to failure by an accelerated life test were 72 to 82 hours, which were significantly longer than the mean time to failure of 3 hours of the laminated ceramic capacitor of comparative sample 90.

The laminated ceramic capacitors of samples 73, 77, and 81 were in the preferable range of the present invention, and had about 0.1% to 5.0 wt % of hydrolyzed di-i-propoxy acetoalkoxy aluminum, in the form of $Al_2O_3$, adhered to 100 wt % of the conductive powder, and a molar ratio of Al, in the form of $Al_2O_3$, contained in the di-i-propoxy acetoalkoxy aluminum to Ca, in the form of CaO, contained in the barium acetylacetonate of less than about 0.5. The reasons the laminated ceramic capacitors of samples 73, 77 and 81 were in the preferable range of the present invention were that the relative dielectric constants thereof were in the acceptable range as a laminated ceramic capacitor, although the relative dielectric constants of 2,060 to 2,110 of the laminated ceramic capacitors of samples 73, 77 and 81 were slightly lower than a relative dielectric constant of 2,140 of the laminated ceramic capacitor of comparative sample 89; the rates of occurrence of delamination ceramic capacitors were all 0%; and the mean times to failure by an accelerated life test were 79 hours, which were significantly longer than a mean time to failure of 3 hours of the laminated ceramic capacitor of comparative sample 90.

The laminated ceramic capacitors of samples 76, 80 and 84 were in the preferable range of the present invention, having about 0.1% to 5.0 wt % of hydrolyzed di-i-propoxy acetoalkoxy aluminum, in the form of $Al_2O_3$, adhered to 100 wt % of the conductive powder, and the molar ratio of Al, in the form of $Al_2O_3$, contained in the di-i-propoxy acetoalkoxy aluminum to Ca, in the form of CaO, contained in the barium acetylacetonate of more than about 4.0. The reasons the laminated ceramic capacitors of samples 76, 80 and 84 were in the preferable range of the present invention were that the mean times to failure thereof were significantly longer than the mean time to failure of 3 hours of the laminated ceramic capacitor of comparative sample 90, although mean times to failure of 29 to 40 hours by an accelerated life test of the laminated ceramic capacitors of samples 76, 80 and 84 were inferior to those of the laminated ceramic capacitors of samples 74, 75, 78, 79, 82 and 83 in the particularly preferable range of the present invention; the rates of occurrence of delamination were all 0%; and the relative dielectric constants were 2,620 to 3,200, which were significantly higher than the relative dielectric constant of 2,140 of the laminated ceramic capacitor of comparative sample 89.

The laminated ceramic capacitors of samples 85 to 87, in which 7.0 wt % of hydrolyzed di-i-propoxy acetoalkoxy aluminum, in the form of $Al_2O_3$, was adhered to 100 wt % of the conductive powder, were in the range of the present invention, and the reasons the laminated ceramic capacitors of samples 85 to 87 were in the range of the present invention were that although the relative dielectric constants thereof were 1,350, which were inferior to the relative dielectric constant of 2,140 of the laminated ceramic capacitor of comparative sample 89, and the mean times to failure by an accelerated life test were 20 to 28 hours, which were inferior to those of the laminated ceramic capacitors of samples 74, 75, 78, 79, 82 and 83 in the particularly preferable range of the present invention, the relative dielectric constants of the laminated ceramic capacitors of samples 85 to 87 were in the acceptable range as a laminated ceramic capacitor; the mean times to failure were sufficiently longer compared to a mean time to failure of 3 hours of the laminated ceramic capacitor of the comparative sample 90; and-the rates of occurrence of delamination were all 0%.

In contrast, in the laminated ceramic capacitors of comparative samples 88 to 90, having no hydrolyzed compound B adhered to the powdered Ni, the rates of occurrence of delamination were high, such as 54% to 100%, and the mean times to failure were very short, such as up to 3 hours. In addition, since the laminated ceramic capacitor of sample 88 had a rate of occurrence of delamination of 100%, the relative dielectric constant and the mean time to failure thereof could not be measured.

EXAMPLE 6

In a manner substantially equivalent to that in Example 1, conductive powders of samples 91 to 108 were prepared except that barium acetylacetonate was used as the compound A, and tributoxy aluminum was used as the compound B, and subsequently, laminated ceramic capacitors of samples.91 to 108 were formed. In this example, oxide contents of individual samples in weight percent basis with respect to 100 wt % of the conductive powder and the molar ratio $Al_2O_3$/BaO are shown in Table 6.

The rate of occurrence of delamination, relative dielectric constants, mean time to failure by an accelerated life test were measured for the laminated ceramic capacitors of samples 91 to 108, and the measurement result and the ranking thereof are shown in Table 6. The measurements and ranking were performed in a manner similar to that in Example 1.

$Al_2O_3$, contained in the tributoxy aluminum to Ba, in the form of BaO, contained in the barium acetylacetonate less than 0.5. The reasons the laminated ceramic capacitors of samples 91, 95 and 99 were in the preferable range of the present invention were that the relative dielectric constants thereof were in the acceptable range as a laminated ceramic capacitor, although relative dielectric constants of 1,520 to 2,110 were slightly lower than a relative dielectric constant of 2,140 of comparative sample 107; the rates of occurrence of delamination were all 0%; and the mean times to failure by an accelerated life test were 77 to 85 hours, which were significantly longer than the mean time to failure of 3 hours of the laminated ceramic capacitor of comparative sample 108.

TABLE 6

| | Conductive powder | | | Laminated Ceramic Capacitor | | | |
|---|---|---|---|---|---|---|---|
| | Compound A | Compound B | | | | | |
| Sample No. | Content of Barium Acetylacetonate as BaO (wt %) | Content of Tributoxy Aluminum as $Al_2O_3$ (wt %) | $Al_2O_3$/BaO (Molar Ratio) | Rate of Occurrence of Delamination (n = 100) | Relative Dielectric Constant | Accelerated Life Test Mean Time to Failure (Hour) | Ranking |
| 91 | 0.8 | 0.1 | 0.2 | 0 | 2,070 | 79 | Good |
| 92 | 0.3 | 0.1 | 0.5 | 0 | 3,120 | 83 | Excellent |
| 93 | 0.04 | 0.1 | 4.0 | 0 | 3,120 | 74 | Excellent |
| 94 | 0.03 | 0.1 | 6.0 | 0 | 2,790 | 30 | Good |
| 95 | 8.0 | 1.0 | 0.2 | 0 | 2,110 | 85 | Good |
| 96 | 3.0 | 1.0 | 0.5 | 0 | 3,080 | 75 | Excellent |
| 97 | 0.4 | 1.0 | 4.0 | 0 | 3,130 | 73 | Excellent |
| 98 | 0.3 | 1.0 | 6.0 | 0 | 2,600 | 33 | Good |
| 99 | 38.0 | 5.0 | 0.2 | 0 | 1,520 | 77 | Good |
| 100 | 15.0 | 5.0 | 0.5 | 0 | 3,080 | 74 | Excellent |
| 101 | 1.9 | 5.0 | 4.0 | 0 | 3,140 | 70 | Excellent |
| 102 | 1.3 | 5.0 | 6.0 | 0 | 3,130 | 36 | Good |
| 103 | 53.0 | 7.0 | 0.2 | 0 | 1,680 | 25 | Fair |
| 104 | 21.0 | 7.0 | 0.5 | 0 | 1,490 | 26 | Fair |
| 105 | 3.0 | 7.0 | 4.0 | 0 | 3,020 | 18 | Fair |
| 106 | 1.0 | 0.0 | 0.0 | 100 | — | — | Poor |
| 107 | 5.0 | 0.0 | 0.0 | 79 | 2,140 | 2 | Poor |
| 108 | 10.0 | 0.0 | 0.0 | 59 | 1,630 | 3 | Poor |

As can be seen from Table 6, the laminated ceramic capacitors of samples 92, 93, 96, 97, 100 and 101, in which about 0.1% to 5.0 wt % of hydrolyzed tributoxy aluminum, in the form of $Al_2O_3$, was adhered to 100 wt % of the conductive powder, and the molar ratio of Al, in the formn of $Al_2O_3$, contained in the tributoxy aluminum to Ba, in the form of BaO, contained in the barium acetylacetonate was in the range of about 0.5 to 4.0, were in the particularly preferable range of the present invention. The reasons the laminated ceramic capacitors of samples 92, 93, 96, 97, 100 and 101 were in the particularly preferable range of the present invention were that the rates of occurrence of delamination thereof were all 0%; the relative dielectric. constants were 3,080 to 3,140, which were significantly higher than the relative dielectric constant of 2,140 of the laminated ceramic capacitor of comparative sample 107; and the mean times to failure by an accelerated life test were 70 to 83 hours, which were significantly longer than the mean time to failure of 3 hours of the laminated ceramic capacitor of comparative sample 108.

The laminated ceramic. capacitors of samples 91, 95 and 99 were in the preferable range of the present invention, having about 0:1% to 5.0 wt % of hydrolyzed tributoxy aluminum, in the form of $Al_2O_3$, adhered to 100 wt % of the conductive powder, and a molar ratio of Al, in the form of The laminated ceramic capacitors of samples 94, 98 and 102 were in the preferable range of the present invention, having about 0.1% to 5.0 wt % of hydrolyzed tributoxy aluminum, in the form of $Al_2O_3$, was adhered to 100 wt % of the conductive powder, and a molar ratio of Al, in the form of $Al_2O_3$, contained in the tributoxy aluminum to Ba, in the form of BaO, contained in the barium acetylacetonate of more than 4.0. The reasons the laminated ceramic capacitors of samples 94, 98 and 102 were in the preferable range of the present invention were that the mean times to failure thereof were significantly longer than the mean time to failure of 3 hours of the laminated ceramic capacitor of comparative sample 108, although the mean times to failure of 30 to 36 hours by an accelerated life test of the laminated ceramic capacitors of samples 94, 98 and 102 were inferior to those of the laminated ceramic capacitors of samples 92, 93, 96, 97, 100 and 101 in the particularly preferable range of the present invention; the rates of occurrence of delamination were all 0%; and the relative dielectric constants were 2,600 to 3,130, which were significantly higher than the relative dielectric constant of 2,140 of the laminated ceramic capacitor of comparative sample 107.

The laminated ceramic capacitors of samples 103 to 105, in which 7.0 wt % of hydrolyzed tributoxy aluminum, in the form of $Al_2O_3$, was adhered to 100 wt % of the conductive powder, were in the range of the present invention, and the reasons the laminated ceramic capacitors of samples 103 to 105 were in the range of the present invention were that although the relative dielectric constants thereof were 1,480 to 3,020, which were inferior to the relative dielectric constant of 2,140 of the laminated ceramic capacitor of comparative sample 107, and the mean times to failure by an accelerated life test were 18 to 26 hours, which were inferior to those of the laminated ceramic capacitors of samples 92, 93, 96, 97, 100 and 101 in the particularly preferable range of the present invention, the relative dielectric constants of the laminated ceramic capacitors of samples 103 to 105 were in the acceptable range as a laminated ceramic capacitor; the mean times to failure were sufficiently longer compared to a mean time to failure of 3 hours of the laminated ceramic capacitor of comparative sample 108; and the rates of occurrence of delamination were all 0%.

In contrast, in the laminated ceramic capacitors of comparative samples 106 to 108, having no hydrolyzed compound B adhered to the powdered Ni, the rates of occurrence of delamination were high, such as 59% to 100%, and the mean times to failure were very short, such as up to 3 hours. In addition, since the laminated ceramic capacitor of sample 106 had a rate of occurrence of delamination of 100%, the relative dielectric constant and the mean time to failure could not be measured.

As has thus been described, the conductive paste of the present invention comprises a conductive powder primarily composed of Ni; an organic vehicle; a compound A which comprises at least one material selected from the group consisting of an organic acid metal salt, an organic metal complex salt and an alkoxide, and which comprises at least one element selected from the group consisting of Mg, Ca and Ba; and a hydrolyzed compound B containing at least one of Al and Si; wherein the hydrolyzed compound B is adhered to the surface of the conductive powder. Accordingly, for example, when the conductive paste of the present invention is used for forming internal electrodes for use in a laminated ceramic electronic component, a laminated ceramic electronic component can be produced having superior heat shock resistance and humidity loading resistance, and in which no delamination of the internal electrode occurs during a firing step.

In addition, the conductive paste of the present invention comprises a conductive powder primarily composed of Ni; an organic vehicle; a compound A which comprises at least one material selected from the group consisting of an organic acid metal salt, an organic metal complex salt and an alkoxide, and which comprises at least one selected from the group consisting of Mg, Ca and Ba; and a hydrolyzed compound B containing at least one of Al and Si; wherein the compound A and the hydrolyzed compound B are adhered to the surface of the conductive powder. Accordingly, for example, when the conductive paste of the present invention is used for forming internal electrodes for use in a laminated ceramic electronic component, a laminated ceramic electronic component can be produced having superior heat shock resistance and humidity loading resistance, and in which no delamination of the internal electrode occurs during a firing step.

Furthermore, by using Ni as a primary component of the conductive powder, a cost reduction of the laminated ceramic electronic component can be accomplished, and the trends toward thinner ceramic layer and an increased number thereof can also be achieved.

What is claimed is:

1. A conductive paste comprising:
   a conductive powder which comprises Ni;
   an organic vehicle;
   a compound A containing at least one of Mg, Ca and Ba and selected from the group consisting of an organic acid metal salt, an organic metal complex salt and an alkoxide; and
   a hydrolyzed compound B adhered to the surface of the conductive powder and containing at least one of Al and Si.

2. A conductive paste according to claim 1, wherein the compound A is adhered to the surface of the conductive powder.

3. A conductive paste according to claim 2, wherein the compound B comprises an alkoxyl group.

4. A conductive paste according to claim 2, wherein the compound B comprises an alkoxide.

5. A conductive paste according to claim 2, wherein the compound B is at least one material selected from the group consisting of an aluminum chelate compound, an aluminum alkoxide, a silane monomer and a silicon alkoxide.

6. A conductive paste according to claim 5, wherein the adhesion amount of the hydrolyzed compound B is about 0.1% to 5.0 wt %, measured as $SiO_2$ and $Al_2O_3$, with respect to 100 wt % of the conductive powder.

7. A conductive paste according to claim 6, wherein the hydrolyzed compound B contains Si and the molar ratio of Si, as $SiO_2$, to the total of Mg, Ca and Ba, as MgO, CaO and BaO, in compound A is in the range of about 0.5 to 10.0.

8. A conductive paste according to claim 6, wherein the hydrolyzed compound B contains Al and the molar ratio of Al, as $Al_2O_3$, to the total of Mg, Ca and Ba, as MgO, CaO, and BaO, in compound A is in the range of about 0.5 to 4.0.

9. A conductive paste according to claim 6, wherein compound A is selected from the group consisting of magnesium acetate, magnesium octylate, calcium octylate, calcium formate, and barium acetylacetonate, and wherein compound B is selected from the group consisting of tetraethoxy silane, methyltriethoxy silane vinyltriethoxy silane, tri-isopropoxy aluminum, di-isopropoxy acetoalkoxy aluminum and tributoxy aluminum.

10. A conductive paste according to claim 1, wherein the compound B is at least one material selected from the group consisting of an aluminum chelate compound, an aluminum alkoxide, a silane monomer and a silicon alkoxide.

11. A conductive paste according to claim 10, wherein the adhesion amount of the hydrolyzed compound B is about 0.1% to 5.0 wt %, measured as $SiO_2$ and $Al_2O_3$, with respect to 100 wt % of the conductive powder.

12. A conductive paste according to claim 11, wherein the hydrolyzed compound B contains Si and the molar ratio of Si, as $SiO_2$, to the total of Mg, Ca and Ba, as MgO, CaO and BaO, in compound A is in the range of about 0.5 to 10.0.

13. A conductive paste according to claim 11, wherein the hydrolyzed compound B contains Al and the molar ratio of Al, as $Al_2O_3$, to the total of Mg, Ca and Ba, as MgO, CaO, and BaO, in compound A is in the range of about 0.5 to 4.0.

14. A conductive paste according to claim 11, wherein compound A is selected from the group consisting of magnesium acetate, magnesium octylate, calcium octylate, calcium formate, and barium acetylacetonate, and wherein compound B is selected from the group consisting of tetraethoxy silane, methyltriethoxy silane vinyltriethoxy silane, tri-isopropoxy aluminum, di-isopropoxy acetoalkoxy aluminum and tributoxy aluminum.

15. In a laminated ceramic electronic component comprising a ceramic laminate having a plurality of ceramic layers laminated with each other and side surfaces and at least one internal electrode between a pair of ceramic layers, the improvement which comprises the internal electrode being a fired conductive paste which comprises:

a conductive powder which comprises Ni;

a compound A containing at least one of Mg, Ca and Ba and selected from the group consisting of an organic acid metal salt, an organic metal complex salt and an alkoxide; and a hydrolyzed compound B adhered to the surface of the conductive powder and containing at least one of Al and Si wherein the compound B is at least one material selected from the group consisting of an aluminum chelate compound, an aluminum alkoxide, a silane monomer and a silicon alkoxide, and wherein the adhesion amount of the hydrolyzed compound B is about 0.1% to 5.0 wt %, measured as $SiO_2$ and $Al_2O_3$, with respect to 100 wt % of the conductive powder.

16. A laminated ceramic electronic component according to claim 15, wherein the compound B is at least one material selected from the group consisting of an aluminum chelate compound, an aluminum alkoxide, a silane monomer and a silicon alkoxide, and-wherein the adhesion amount of the hydrolyzed compound B is about 0.1% to 5.0% wt %, measured as $SiO_2$ and $Al_2O_3$, with respect to 100 wt % of the conductive powder.

17. A laminated ceramic electronic component according to claim 16, wherein the compound A is adhered to the surface of the conductive powder.

18. A laminated ceramic electronic component according to claim 17, wherein the ceramic layer comprises barium titanate and further comprising at least one terminal electrode on a side surface of the laminate in electrical contact with the internal electrode.

19. In a laminated ceramic electronic component comprising a ceramic laminate having a plurality of ceramic layers laminated with each other and side surfaces and at least one internal electrode between a pair ceramic layers, the improvement which comprises the internal electrode being a fired conductive paste which comprises:

a conductive powder which comprises Ni;

a compound A containing at least one of Mg, Ca and Ba and selected from the group consisting of an organic metal complex salt and an alkoxide; and a hydrolyzed compound B adhered to the surface of the conductive powder and containing at least one of Al and Si.

20. A laminated ceramic electronic component according to claim 19, wherein the ceramic layer comprises barium titanate and further comprising at least one terminal electrode on a side surface of the laminated in electrical contact with the internal electrode.

* * * * *